(12) United States Patent
Sato

(10) Patent No.: US 8,729,967 B2
(45) Date of Patent: May 20, 2014

(54) SURFACE-MOUNTED CRYSTAL OSCILLATOR AND MANUFACTURING METHOD THEREOF

(75) Inventor: Masashi Sato, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 9 days.

(21) Appl. No.: 13/604,621

(22) Filed: Sep. 5, 2012

(65) Prior Publication Data
US 2013/0063217 A1    Mar. 14, 2013

(30) Foreign Application Priority Data

Sep. 8, 2011  (JP) ................. 2011-196044
Sep. 14, 2011 (JP) ................. 2011-200355
Apr. 6, 2012  (JP) ................. 2012-087407

(51) Int. Cl.
*H03H 9/10* (2006.01)
*H03H 9/05* (2006.01)

(52) U.S. Cl.
USPC ............................. 331/68; 331/158; 310/348

(58) Field of Classification Search
USPC ................................................. 331/68, 158
See application file for complete search history.

(56) References Cited

U.S. PATENT DOCUMENTS 6,587,008 B2 *  7/2003  Hatanaka et al. ............... 331/68
7,034,441 B2 *  4/2006  Ono et al. ..................... 310/344

FOREIGN PATENT DOCUMENTS

| JP | 2001-110925 | 4/2001 |
| JP | 2003-179456 | 6/2003 |
| JP | 2007-158419 | 6/2007 |

* cited by examiner

Primary Examiner — Joseph Chang
(74) Attorney, Agent, or Firm — Jianq Chyun IP Office

(57) ABSTRACT

There are provided a surface-mounted crystal oscillator and a manufacturing method thereof which can realize miniaturization, improve quality, reduce a manufacturing cost, and enhance productivity. According to the surface-mounted crystal oscillator and the manufacturing method thereof, through terminals and of AgPd are formed on wall surfaces of through holes formed at corner portions of a rectangular ceramic substrate, a metal electrode of a support electrode lower portion of AgPd which is connected to the through terminal and forms a lower layer of a support electrode is formed on a front side of the substrate, the support electrode which holds a crystal piece is formed on the support electrode lower layer portion by using Ag, and a cover is mounted on an insulating film formed on the inner side of the periphery of the substrate and effect airtight sealing.

19 Claims, 16 Drawing Sheets

SURFACE-MOUNTED CRYSTAL OSCILLATOR AND MANUFACTURING METHOD THEREOF

CROSS-REFERENCE TO RELATED APPLICATIONS

This application claims the priority benefit of Japan application serial no. 2011-196044, filed on Sep. 8, 2011, serial no. 2012-087407, filed on Apr. 6, 2012, and serial no. 2011-200355, filed on Sep. 14, 2011. The entirety of each of the above-mentioned patent applications is hereby incorporated by reference herein and made a part of this specification.

BACKGROUND OF THE INVENTION

1. Field of the Invention

The present invention relates to a crystal oscillator for surface mounting, and more particularly to a surface-mounted crystal oscillator and a manufacturing method thereof that can improve productivity and miniaturization.

2. Description of the Related Art

[Prior Art]

Since a surface-mounted crystal oscillator has a small size and light weight, it is particularly built into a portable type electronic device as a frequency or time reference source.

As conventional surface-mounted crystal oscillators, there is one which has a crystal piece mounted on a ceramic substrate and has a concave cover put upside down to effect airtight sealing. In recent years, a frequency deviation Δf/f is relatively moderate, and there is an inexpensive consumer surface-mounted crystal oscillator of, e.g., ±150 to ±250 ppm.

In particular, a general configuration of a conventional surface-mounted crystal oscillator is that a pattern of a metal electrode of, e.g., AgPd (silver.palladium) is formed on a ceramic substrate, a support electrode of AgPd is laminated on a portion that supports a crystal piece, and the crystal piece is lifted by this support electrode.

That is because oscillation is obstructed and an equivalent resistance value is deteriorated when a central portion of the crystal piece comes into contact with a surface of the ceramic substrate (a base), and hence the support electrode on which the crystal piece is mounted must be raised from a base surface to some extent.

It is to be noted that the metal electrode and the support electrode are made of AgPd because this substance is hardly oxidized.

[Related Art]

In addition, as related arts, there are Japanese Patent Publication No. 2007-158419 "Surface-mounted Crystal Oscillator" (Nihon Dempa Kogyo Co., Ltd.) [Patent Document 1], Japanese Patent Publication No. 2003-179456 "Crystal Product Surface-mounted Container and Crystal Product Using This" (Nihon Dempa Kogyo Co., Ltd.) [Patent Document 2], and Japanese Patent Publication No. 2001-110925 "Conductive Cap, Electronic Component, and Insulating Coating Forming Method of Conductive Cap" (Murata Manufacturing Co., Ltd.) [Patent Document 3].

Patent Document 1 discloses a configuration that a crystal piece 3 is mounted on an IC chip 2, the IC chip 2 and others are formed on a mount board 4, and a metal cover 5 is provided in a surface-mounted crystal oscillator.

Further, Patent Document 2 discloses a configuration that a crystal piece 3 is provided on a single-layer substrate 1A through a crystal terminal 6 and airtightly sealed by a cover 2 in a crystal product surface-mounted crystal oscillator.

Furthermore, Patent Document 3 discloses that an insulating film 55 having a rectangular frame shape is formed on a substrate 51 at a portion where a lower opening end surface of a metal cap 52 is in contact with an upper surface 51a of the substrate 51 in [0005] of Prior Art.

Patent Document 1: Japanese Patent Publication No. 2007-158419
Patent Document 2: Japanese Patent Publication No. 2003-179456
Patent Document 3: Japanese Patent Publication No. 2001-110925

However, in a conventional surface-mounted crystal oscillator, although the metal electrode and the support electrode are made of AgPd because this material is hardly oxidized, since the support electrode requires a thickness to keep the crystal piece away from the base surface, AgPd is applied, e.g., three times by screen printing and laminated for the support electrode, and hence there is a problem that manufacture of the surface-mounted crystal oscillator is complicated.

Since AgPd has low viscosity in particular, a thick film cannot be formed at a time, and hence a process of forming a thin film and laminating the thin film is required.

Moreover, since AgPd has low viscosity, the support electrode is formed on the metal electrode, but an AgPd film of the support electrode may sag and protrude to the periphery of the metal electrode in some cases.

Additionally, since a cost of Pd (palladium) is approximately 22-fold of that of Ag (silver), and there is a problem that a manufacturing cost rises as an amount of Pd used increases.

Further, in the conventional surface-mounted crystal oscillator, there is a cantilever type that holds a crystal piece at two positions of one narrow side, but there is a region where pulled wiring lines of connection terminals connected to the support electrode at the two positions protrude to the outside of the crystal piece as seen from a top surface of the crystal piece.

Furthermore, in frequency adjustment in a manufacturing process, although an excitation electrode of the crystal piece is scraped away by argon (Ar) ions, but a region protruding to the outside of the crystal piece may be possibly scraped away, and there is a problem that positioning of an ion gun of a regulator is difficult.

SUMMARY OF THE INVENTION

In view of the above-described problem, it is an object of the present invention to provide a surface-mounted crystal oscillator and a manufacturing method thereof that can realize miniaturization, enhance quality, reduce a manufacturing cost, an improve productivity.

To solve the above-described problems in the conventional examples, according to the present invention, there is provided a surface-mounted crystal oscillator which has a crystal piece mounted on a rectangular ceramic substrate, comprising: first and second support electrodes which hold the crystal piece; through terminals which are formed on wall surfaces of through holes formed at corner portions of the substrate; first and second lower layer portions which are formed in lower layers of the first and second support electrodes on a front side of the substrate; a first connection terminal which connects an end portion of the first lower layer portion with the through terminal at the corner portion that is the closest to the end portion; a second connection terminal which connects an end portion of the second lower layer potion to the through terminal at the corner portion that is the closest to the end portion; and a cover which covers and airtightly seals the crystal piece, wherein the through terminals, the lower layer portions, and the connection terminals are formed of an antioxidant metal film, and the first and second support electrodes are formed by using silver, and it is possible to obtain effects of realizing miniaturization, enhancing quality, reducing a manufacturing cost, and improving productivity.

According to the present invention, in the surface-mounted crystal oscillator, the first connection terminal and the second connection terminals are connected to the through terminals at the opposing corners of the substrate, and the end portions of the first and second lower layer portions to which the first and second connection terminals are not connected are shorter than the end portions of the first and second lower layer portions to which the first and second connection terminals are connected.

According to the present invention, in the surface-mounted crystal oscillator, a belt-like insulating film on which the cover is mounted is formed on the inner side of the periphery of the substrate.

According to the present invention, in the surface-mounted crystal oscillator, the antioxidant metal film is formed by using an alloy containing silver as a main component.

According to the present invention, in the surface-mounted crystal oscillator, the antioxidant metal film is formed by using an alloy of palladium containing silver as a main component.

According to the present invention, in the surface-mounted crystal oscillator, the crystal piece is beveled and has inclined short sides, and each of the first and second support electrodes is divided into a first portion and a second portion and formed at the end portions of each of the first and second lower layer portions in such a manner that a space portion is formed at a central part of each of the first and second lower layer portions above each lower layer portion, a lens-like trunk portion of the crystal piece protrudes toward the space portion, pressing of the conductive adhesive in the support electrodes is sufficient, and hence an effect of increasing the adhesive strength of the crystal piece can be obtained.

According to the present invention, in the surface-mounted crystal oscillator, the beveled crystal piece is fixed through a conductive adhesive to an upper side of the second portion of each of the divided first and second support electrodes formed at the end portions of each of the first and second lower layer portions connected to the first and second connection terminals.

According to the present invention, in the surface-mounted crystal oscillator, a surface area of the second portion of each of the divided first and second support electrodes is larger than a surface area of the first portion of each of the divided first and second support electrodes formed on the end portion of each of the first and second lower layer portions that are not connected to the first and second connection terminals.

According to the present invention, there is provided a manufacturing method of a surface-mounted crystal oscillator which has a crystal piece mounted on a rectangular ceramic substrate, comprising: forming through terminals on wall surfaces of through holes formed at corner portions of the substrate; using an antioxidant metal film to form, on a front side of the substrate, first and second lower layer portions in lower layers of first and second support electrodes which hold the crystal piece, a first connection terminal which connects an end portion of the first lower layer portion to the through terminal at the corner portion that is the closest to the end portion, and a second connection terminal which connects an end portion of the second lower layer portion to the through terminal at the corner portion that is the closest to the end portion; forming the first and second support electrodes on the first and second lower layer portions by using silver; and providing a cover which covers and airtightly seals the crystal piece, and it is possible to obtain effects of realizing miniaturization, enhancing quality, reducing a manufacturing cost, and improving productivity.

According to the present invention, in the manufacturing method of a surface-mounted crystal oscillator, the first connection terminal and the second connection terminal are connected to the through terminals at the opposing corners of the substrate, and the end portions of the first and second lower layer portions to which the first and second connection terminals are not connected are formed to be shorter than the end portions of the first and second lower layer portions to which the first and second connection terminals are connected.

According to the present invention, in the manufacturing method of a surface-mounted crystal oscillator, the first and second support electrodes are formed by a single operation using a metal mask.

According to the present invention, in the manufacturing method of a surface-mounted crystal oscillator, the antioxidant metal film is formed by using an alloy which contains silver as a main component.

According to the present invention, in the manufacturing method of a surface-mounted crystal oscillator, the antioxidant metal film is formed by using an alloy of palladium which contains silver as a main component.

According to the present invention, in the manufacturing method of a surface-mounted crystal oscillator, since there is provided the manufacturing method of a surface-mounted crystal oscillator in which the crystal piece that is beveled and has inclined short sides is mounted, and each of the first and second support electrodes is divided into a first portion and a second portion and formed at the end portions of each of the first and second lower layer portions in such a manner that a space portion is formed at a central part of each of the first and second lower layer portions above each lower layer portion, a lens-like trunk portion of the crystal piece protrudes toward the space portion, the pressing of the conductive adhesive in the support electrodes is sufficient, and hence an effect of increasing the adhesive strength of the crystal piece can be obtained.

According to the present invention, in the manufacturing method of a surface-mounted crystal oscillator, the beveled crystal piece is fixed through a conductive adhesive to an upper side of the second portion of each of the divided first and second support electrodes formed at the end portions of each of the first and second lower layer portions connected to the first and second connection terminals.

According to the present invention, in the manufacturing method of a surface-mounted crystal oscillator, a surface area of the second portion of each of the divided first and second support electrodes is set larger than a surface area of the first portion of each of the divided first and second support electrodes formed on the end portion of each of the first and second lower layer portions that are not connected to the first and second connection terminals.

Furthermore, according to the present invention, there is provided a surface-mounted crystal oscillator which has a crystal piece mounted on a rectangular ceramic substrate, comprising: first and second support electrodes each of which holds the crystal piece on one of short sides thereof; through terminals formed on wall surfaces of through holes formed at corner portions of the substrate; first and second lower layer portions which are formed in lower layers of the first and second support electrodes on a front side of the substrate; a first connection terminal which connects an end portion of the first lower layer portion to the through terminal at the corner portion that is the closest to the end portion; a second connection terminal which connects an end portion of the second lower layer portion to the through terminal at the corner portion that is an opposing corner of the through terminal connected with the first lower layer portion on the substrate; and a cover which covers and airtightly seals the crystal piece, wherein the through terminals, the lower layer portions, and the connection terminals are formed of an antioxidant metal film, and the first and second support electrodes are formed by using silver, and it is possible to obtain effects of realizing miniaturization, enhancing quality, reducing a manufacturing cost, and improving productivity.

According to the present invention, in the surface-mounted crystal oscillator, there is provided the surface-mounted crystal oscillator in which the second connection terminal has: a first portion having one end connected to an end portion of the second lower layer portion on a substrate center side and the other end extended in a direction of the through terminal connected along a long side of the substrate; and a second portion having one end connected with the other end of the first portion and the other end connected with the through terminal, the first portion of the second connection terminal is formed at a position where it is hidden behind the crystal piece to be mounted, hence the wiring pattern of the first portion is not scraped off by argon ions at the time of frequency adjustment, and quality and productivity can be improved.

According to the present invention, in the surface-mounted crystal oscillator, a belt-like insulating film on which the cover is mounted is formed on the inner side of the periphery of the substrate.

According to the present invention, in the surface-mounted crystal oscillator, the antioxidant metal film is formed by using an alloy which contains silver as a main component.

According to the present invention, in the surface-mounted crystal oscillator, the antioxidant metal film is formed by using an alloy of palladium which contains silver as a main component.

According to the present invention, there is provided a manufacturing method of a surface-mounted crystal oscillator having a crystal piece mounted on a rectangular ceramic substrate, comprising: forming through terminals on wall surfaces of through holes formed at corner portions of the substrate; forming first and second lower layer portions in lower layers of first and second support electrodes each of which holds the crystal piece by one of short sides thereof, a first connection terminal which connects an end portion of the first lower layer portion to the through terminal at the corner portion which is the closest to the end portion, and a second connection terminal which connects an end portion of the second lower layer portion to the through terminal at the corner portion provided at the opposing corner of the through terminal connected by the first lower layer on the front side of the substrate by using an antioxidant metal film; forming the first and second support electrodes on the first and second lower layer portions by using silver; and providing a cover which covers and airtightly seals the crystal piece, and it is possible to obtain effects of realizing miniaturization, enhancing quality, reducing a manufacturing cost, and improving productivity.

According to the present invention, in the manufacturing method of a surface-mounted crystal oscillator, there is provided the manufacturing method of a surface-mounted crystal oscillator that the second connection terminal is formed so as to have a first portion which has one end connected to an end portion of the second lower layer portion on a substrate central side and the other end extended in a through terminal direction connected along a long side of the substrate and a second portion which has one end connected to the other end of the first portion and the other end connected to the through terminal, since the first portion of the second connection terminal is formed at a position where it is hidden behind the crystal piece to be mounted, a wiring pattern of the first portion is not scraped away by argon ions at the time of frequency adjustment, and an effect of improving quality and productivity can be obtained.

According to the present invention, in the manufacturing method of a surface-mounted crystal oscillator, the first and second support electrodes are formed at a time by using a metal mask.

According to the present invention, in the manufacturing method of a surface-mounted crystal oscillator, the antioxidant metal film is formed by using an alloy containing silver as a main component.

According to the present invention, in the manufacturing method of a surface-mounted crystal oscillator, the antioxidant metal film is formed by using an alloy of palladium containing silver as a main component.

DESCRIPTION OF REFERENCE NUMERALS

1 . . . substrate (base), 2a, 2a1, 2a2, and 2a3 . . . connection terminal, 2b and 2c . . . through terminal, 3a . . . support electrode lower layer portion, 3a' . . . support lower layer portion, 3b . . . support electrode, 3b1 . . . first portion of support electrode, 3b2 . . . second portion of support electrode, 3b' . . . support portion, 4 . . . mounting terminal, 5 and 5' . . . crystal piece, 5a . . . excitation electrode, 5b . . . extracting electrode, 6 . . . cover, 7 . . . conductive adhesive, 10 . . . insulating film

DESCRIPTION OF PREFERRED EMBODIMENT

Embodiments according to the present invention will now be described hereinafter with reference to the drawings.
[Outline of First Embodiment]

In a surface-mounted crystal oscillator according to a first embodiment of the present invention, through terminals of AgPd are formed on wall surfaces of through holes formed at corner portions of a rectangular ceramic substrate, metal electrodes of AgPd that are connected to the through terminals and form lower layers of support electrodes are formed on a surface of the substrate, and the support electrodes of Ag that hold a crystal piece are formed on the metal electrodes, thereby reducing a manufacturing cost and improving productivity while realizing miniaturization.

In particular, as to the support electrode, since a metal mask is used in place of a screen mask to thickly form an Ag film at a time, a manufacturing cost can be reduced, and a manufacturing process can be simplified.
[Presupposition of Embodiments]

In conventional examples, the support electrode that supports the crystal piece is made of AgPd because AgPd printing has excellent environmental resistance and an AgPd film is hardly oxidized.

In first to third embodiments, since a metal cover is put on a crystal piece and a package is airtightly sealed by N2 purge, oxidation hardly occurs even if each support electrode in the package is made of Ag.

It is to be noted that the N2 purge is an operation of supplying nitrogen into the package and removing oxygen and others.

Figure 1:
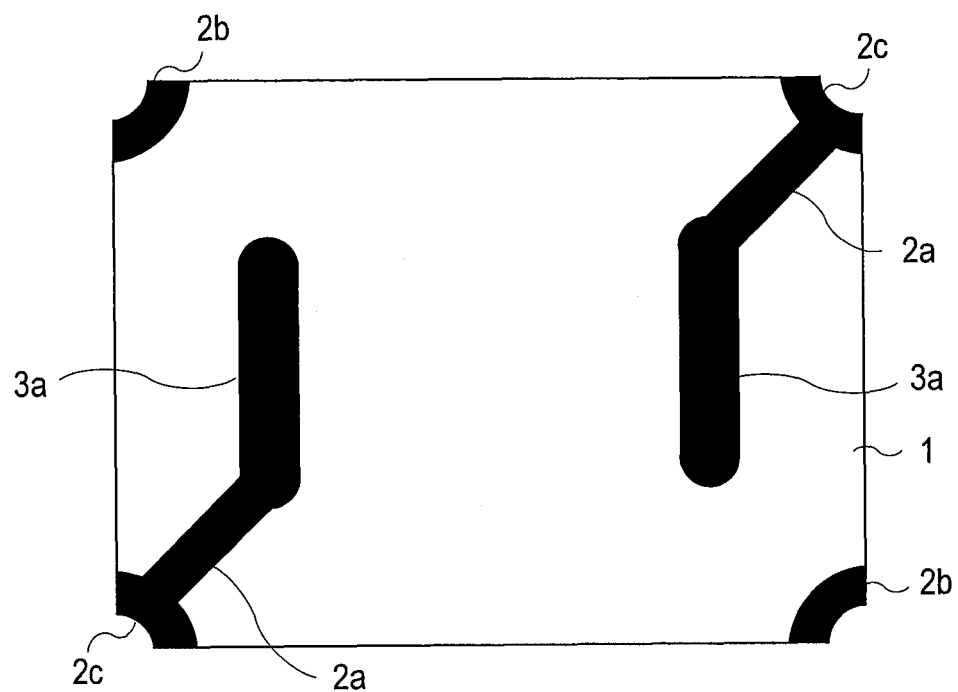
FIG. 1 is a plane explanatory view of an electrode pattern in a first crystal oscillator.

However, since metal electrodes and through terminals drawn out from the package are exposed to air, they must be formed by using AgPd.
[Electrode Pattern of First Crystal Oscillator: FIG. 1]

A first surface-mounted crystal oscillator (a first crystal oscillator) according to an embodiment of the present invention will now be described with reference to FIG. 1. FIG. 1 is a plane explanatory view of an electrode pattern in the first crystal oscillator.

As shown in FIG. 1, an electrode pattern of metal electrodes in the first crystal oscillator basically has a pattern of support electrode lower layer portions 3a serving as lower layers of support electrodes, through terminals 2b and 2c formed at four corners of a base 1, and a pattern of connection terminals 2a that connect the support electrode lower layer portions 3a to the through terminals 2c on the ceramic substrate (the base) 1.

Here, the through terminal connected with the connection terminal 2a is determined as 2c, the through terminal that is not connected with the connection terminal 2a is determined as 2b so that these through terminals are discriminated from each other.

Here, respective portions of the electrode patterns will now be specifically described.

In regard to each of the through terminals 2b and 2c, a through hole is formed at an intersection point of break lines that determine a region of each crystal oscillator, a metal film is formed on a wall surface of the through hole, and this film serves as an electrode that connects front and back sides of the base to each other.

Further, each of the through terminals 2b and 2c has a fan-like pattern excluding a through hole portion on the front and back sides of the base so as to facilitate connection of any other electrode.

The connection terminal 2a is linearly connected to the through terminal 2c at the corner portion which is the closest to an end portion of the support electrode lower layer portion 3a.

Furthermore, the connection terminal 2a is connected to each of the diagonally placed through terminals 2c. In FIG. 1, one connection terminal 2a is connected to the through terminal 2c at the lower left portion, and the other connection terminal 2a is connected to the through terminal 2c at the upper right portion.

When the connection terminals 2a are diagonally provided, even if a cover slips in an up-and-down direction in FIG. 1, the cover can be prevented from coming into contact with the end portion of the support electrode lower layer portion 3a which is not connected with the connection terminal 2a, thereby improving quality.

Moreover, in the support electrode lower layer portion 3a, the end portion thereof that is not connected with the connection terminal 2a is shorter than the other end portion thereof that is connected with the connection terminal 2a.

That is, comparing a distance (A) from the end portion of the support electrode lower layer portion 3a connected with the connection terminal 2a to a close long side of the base with a distance (B) from the end portion of the support electrode lower layer portion 3a that is not connected with the connection terminal 2a to the close long side of the base, the distance (B) is longer than the distance (A).

Figure 2:
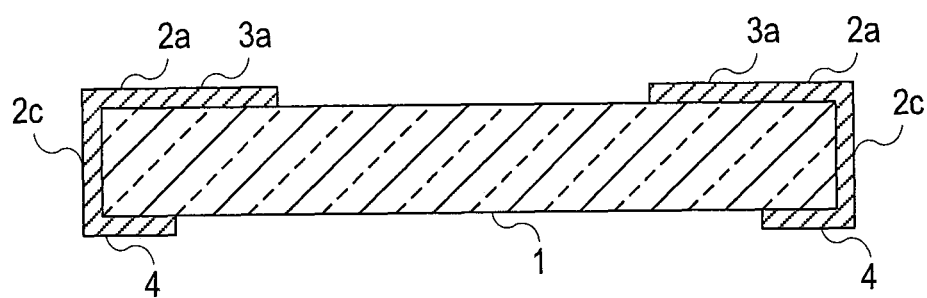
FIG. 2 is a cross-sectional explanatory view of a state that an electrode pattern in the first crystal oscillator is formed.

Therefore, at the upper left and lower right portions in FIG. 1, when a space extending from the end portion of the support electrode lower layer portion 3a (the end portion that is not connected with the connection terminal 2) to the close long side is increased, the cover which will be mounted later does not come into contact with this end portion even if the cover slightly slips in the up-and-down direction in FIG. 1, and the quality can be improved.
[Cross Section of Electrode Pattern of First Crystal Oscillator: FIG. 2]

FIG. 2 shows a cross-sectional explanatory view of a state that an electrode pattern is formed on the base 1. FIG. 2 is a cross-sectional explanatory view showing a state that the electrode pattern of the first crystal oscillator is formed.

As shown in FIG. 2, on the front side of the base 1, the support electrode lower layer portion 3a and the connection terminal 2a are integrally formed by using AgPd, and the through terminal 2b and 2b that connect the front side and the back side of the base 1 to each other are also formed.

Further, on the back side of the base 1, electrode patterns of mounting terminals 4 connected with the respective through terminals 2b and 2c are formed by using AgPd.

Figure 3:
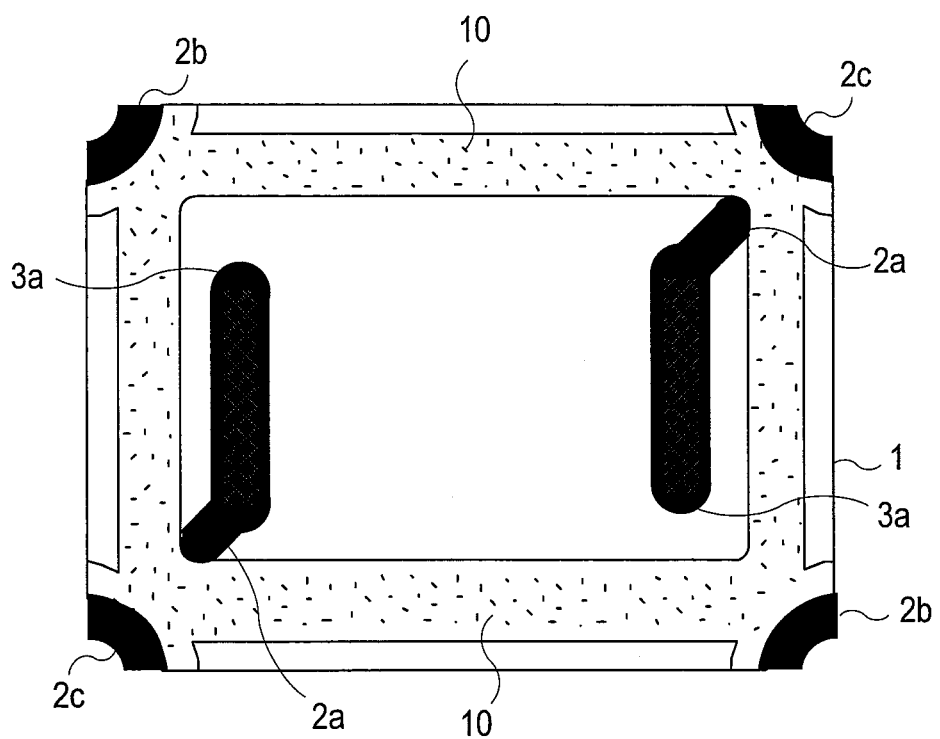
FIG. 3 is a plane explanatory view of an insulating film pattern in the first crystal oscillator.

The mounting terminal 4 connected with the through terminal 2c serves as an electrode to which a voltage is applied, and the mounting terminal 4 connected with the through terminal 2b serves as a GND electrode connected with the ground level.
[Formation of Insulating Film of First Crystal Oscillator: FIG. 3]

Formation of an insulating film of the first crystal oscillator will now be described with reference to FIG. 3. FIG. 3 is a plane explanatory view of an insulating film pattern of the first crystal oscillator.

As shown in FIG. 3, an insulating film 10 is formed into a belt-like shape to circle around the inner side of the periphery on the front side of the base 1 by using glass or the like, and it covers and cuts across the connection terminals 2a on the base 1.

Furthermore, the insulating film 10 is formed on the inner side part from the outer peripheral end of the base 1, and it does not cover the corner portions where the through terminals 2b and 2c are formed.

However, the slip of the cover may be taken into consideration, and the insulating film 10 may be extended to the central side of the through terminals 2b and 2c. The central side means a line end portion when the corner portions of the base 1 are diagonally connected.

Figure 4:
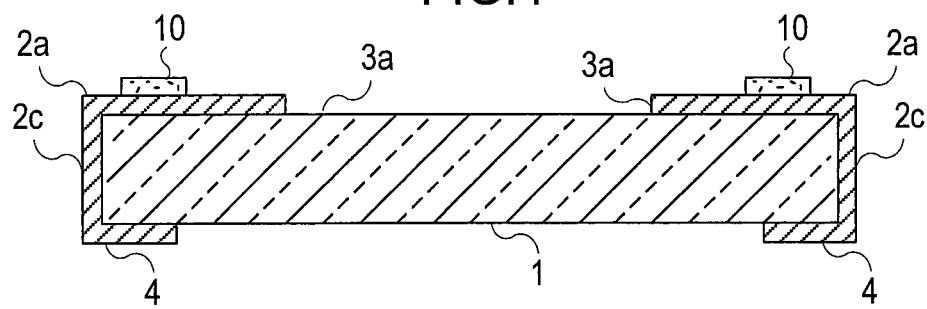
FIG. 4 is a cross-sectional explanatory view of a state that an insulating film in the first crystal oscillator is formed.

[Cross Section of Formation of Insulating Film of First Crystal Oscillator: FIG. 4]

FIG. 4 shows a cross-sectional explanatory view of a state that the insulating film is formed. FIG. 4 is a cross-sectional explanatory view of a state that the insulating film of the first crystal oscillator is formed.

As shown in FIG. 4, the insulating film 10 is formed so as to circle around the inner side of the periphery on the front side of the base 1. It is to be noted that the insulating film 10 is also formed on the connection terminals 2a.

Figure 5:
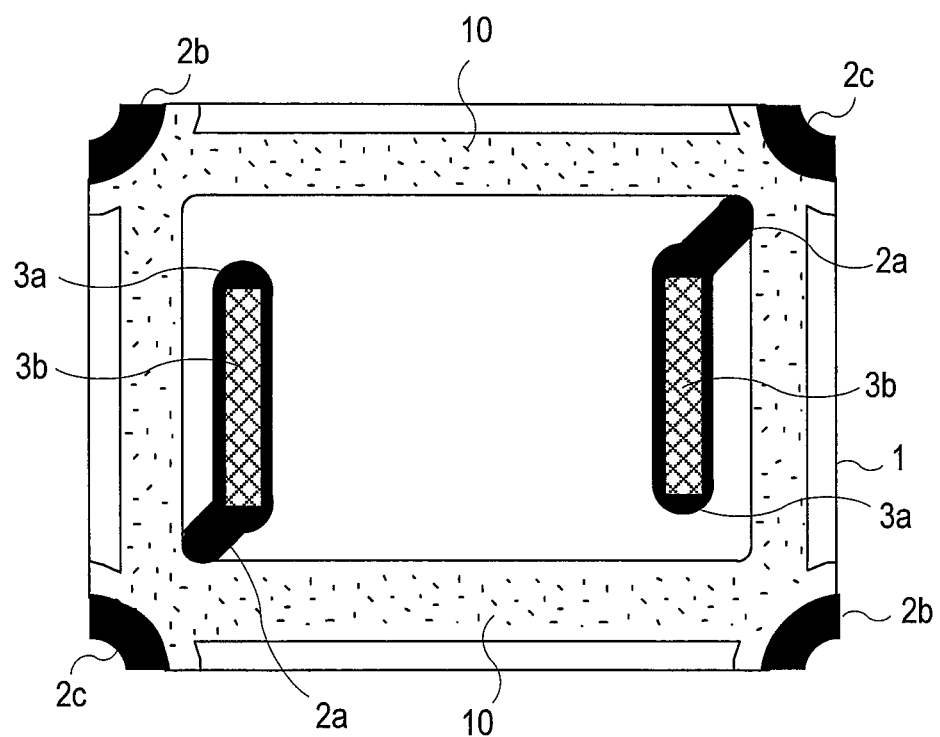
FIG. 5 is a plane explanatory view of a support electrode pattern in the first crystal oscillator is formed.

[Support Electrode Pattern of First Crystal Oscillator: FIG. 5]

A support electrode pattern of the first crystal oscillator will now be described with reference to FIG. 5. FIG. 5 is a plane explanatory view of the support electrode pattern of the first crystal oscillator.

As shown in FIG. 5, support electrodes 3b are laminated on the support electrode lower layer portions 3a, and they are made of Ag.

Since Ag is used for each support electrode 3b, this electrode has high viscosity, and a thick metal film can be formed by one applying operation using a metal mask. A thickness of the support electrode 3b formed by one applying operation corresponds to three layers of a conventional metal film (having low viscosity) using AgPd.

That is, to form the support electrode 3b having the same thickness, applying an Ag film once can suffice in the first embodiment, but the conventional AgPd film must be applied three times, a large amount of Pd is used, a cost is increased, and an operation process is complicated.

Further, since Ag having high viscosity is used for the support electrode 3b, it does not sag and not protrude from the support electrode lower layer portion 3a, and a possibility of a short circuit can be reduced even though the metal cover slips and is mounted in this state.

Figure 6:
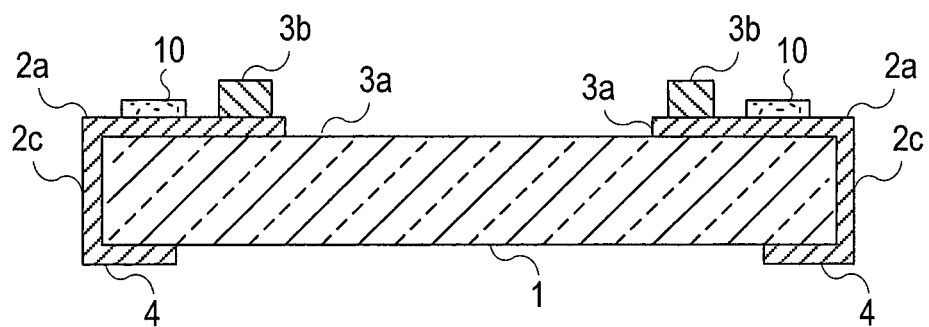
FIG. 6 is a cross-sectional explanatory view showing a state that the support electrode pattern in the first crystal oscillator is formed.

[Cross Section of Support Electrode Pattern of First Crystal Oscillator: FIG. 6]

FIG. 6 shows a cross-sectional explanatory view of a state that the support electrode pattern is formed. FIG. 6 is a cross-sectional explanatory view of a state that the support electrode pattern in the first crystal oscillator is formed.

As shown in FIG. 6, the support electrode 3b is formed on the support electrode lower layer portion 3a so as to be thicker than the support electrode lower layer portion 3a.

Figure 7:
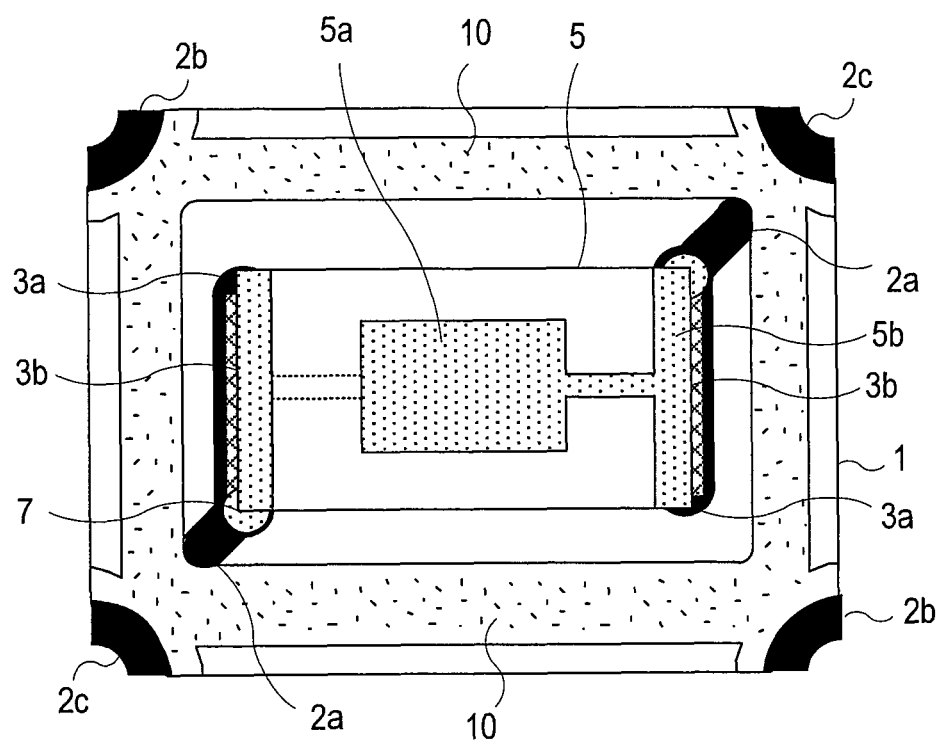
FIG. 7 is a plane explanatory view of mounting a crystal piece in the first crystal oscillator.

[Mounting of Crystal Piece of First Crystal Oscillator: FIG. 7]

Mounting of the crystal piece in the first crystal oscillator will now be described with reference to FIG. 7. FIG. 7 is a plane explanatory view of mounting of the crystal piece in the first crystal oscillator.

The crystal piece 5 is AT-cut, and opposed excitation electrodes 5a are formed on both main surfaces of the crystal piece 5.

Additionally, extracting electrodes 5b that are extended from the excitation electrode 5a to both end portions in opposite directions and folded back over the entire width in the width direction are formed to the crystal piece 5.

Further, a pair of extended diagonal portions (end portions) of the extracting electrodes 5b are secured to the support electrodes 3b through a conductive adhesive 7 as a conductive material, thereby electrically/mechanically connecting the extracting electrodes 5b to the support electrodes 3b.

Figure 8:
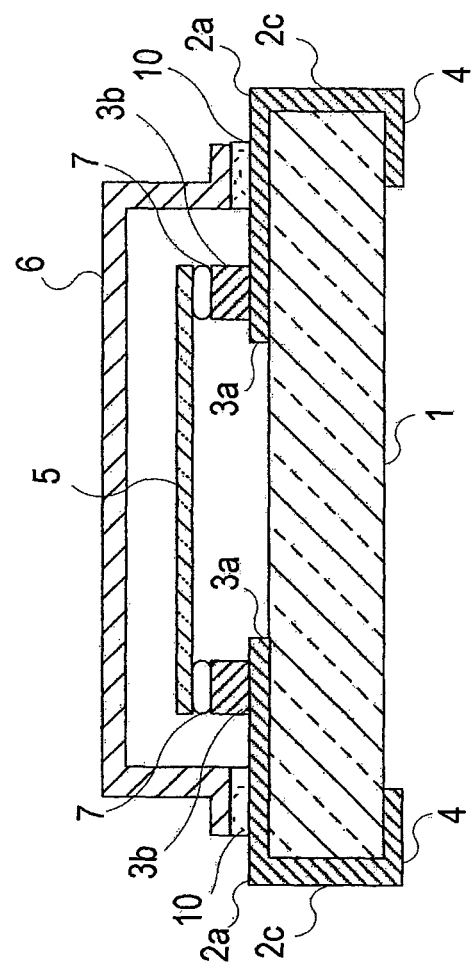
FIG. 8 is a cross-sectional explanatory view of a state that a cover is mounted on the first crystal oscillator.

[Cross Section of First Crystal Oscillator: FIG. 8]

A cross section of a state that the cover is mounted on the first crystal oscillator will now be described with reference to FIG. 8. FIG. 8 is a cross-sectional explanatory view of a state that the cover is mounted on the first crystal oscillator.

As shown in FIG. 8, the crystal piece 5 is mounted on the support electrodes 3b through the conductive adhesive 7, and a metal cover 6 is mounted on the insulating film 10 through a resin as an insulative sealing material.

The cover 6 has a concave shape, an opening end surface thereof is bent into an L-like shape, this concave shape is inverted, and this L-like portion is bonded to the insulating film 10 through a resin of a sealant.

In case of sealing by using the cover 6, since airtight sealing is effected based on N2 purge, the support electrodes 3b made of Ag are not oxidized, and there is no problem in quality.

[Manufacturing Method of First Crystal Oscillator]

A manufacturing method of the first crystal oscillator will now be described.

[First Step/Baking of Sheet-Like Ceramic Material]

First, a sheet-like ceramic material from which a sheet-like ceramic base is made is formed.

In the sheet-like ceramic material, break lines that partition adjacent regions in accordance with respective ceramic bases 1 are formed, and through holes are formed at four corner portions (corner portions).

Furthermore, the sheet-like ceramic materials having the through holes formed therein are baked, thereby obtaining the sheet-like ceramic bases.

[Second Step/Formation of Circuit Pattern]

Then, in a region associated with a circuit pattern of the sheet-like ceramic base, a metal paste of an AgPd alloy is formed with a thickness of approximately 10 μm by printing using a screen mask.

As the circuit pattern, a metal pattern is formed on one main surface (the front side) as shown in FIG. 1, a pattern of the mounting terminals 4 is formed on the other main surface (the back side), and the through terminals 2b and 2c are formed on the wall surfaces of the through holes.

Moreover, a metal paste containing an AgPd alloy is baked at approximately 850° C., a binder in the metal paste is evaporated, and the AgPd alloy is molten and solidified, whereby the sheet-like ceramic base having the metal pattern formed thereof is obtained.

It is to be noted that since a firing temperature of the ceramic is approximately 1500 to 1600° C. and the same of the AgPd alloy is 850° C. which is lower than the former temperature, the AgPd alloy paste is applied after baking the ceramic, and the AgPd alloy paste is baked together with the ceramic.

That is because, when the AgPd alloy paste is applied to the ceramic material and baking is performed at the firing temperature of the ceramic, the AgPd alloy paste has an extremely high temperature and becomes aggregate particles and the circuit pattern cannot be formed.

[Third Step/Formation of Insulating Film 10]

Formation of the insulating film 10 will now be described.

A glass paste is formed by printing as the insulating film 10 on the inner side of the periphery of each rectangular region (corresponding to each base 1) of the sheet-like ceramic base having the metal pattern or the like formed thereon.

Additionally, baking is performed at a temperature of approximately 850° C., and the glass is solidified.

[Fourth Step/Formation of Support Electrode 3b]

Formation of the support electrode 3b will now be described.

As shown in FIGS. 5 and 6, each support electrode 3b is formed of a metal film of Ag on the support electrode lower layer portion 3a of AgPd by using a metal mask of nickel (Ni).

Since the support electrode 3b is the metal film of Ag, it has high viscosity, and a thick film can be formed by a single film forming operation. Therefore, the support electrode 3b does not sag and does not protrude from the support electrode lower layer portion 3a.

[Fifth Step/Mounting of Crystal Piece]

Then, the crystal piece 5 having each extracting electrode 5b protruding from the excitation electrode 5a is secured to, mounted on, and electrically/mechanically connected to the respective support electrodes 3b of the sheet-like ceramic base having the metal pattern or the like formed thereof through the conductive adhesive 7.

[Sixth Step/Frequency Adjustment]

An oscillation frequency of each crystal piece 5 as a crystal oscillator mounted (secured) on the sheet-like ceramic base is adjusted by a mass loading effect.

Specifically, on the back side of the sheet-like ceramic base, a measuring terminal (a probe) from a measuring instrument is brought into contact with each mounting terminal 4 electrically connected to each crystal piece 5. Further, gas ions are applied to the excitation electrode 5a on the front side of the crystal piece 5 having an exposed plate surface, this surface is scraped away, a mass of the excitation electrode 5a is reduced, and the oscillation frequency is adjusted to have a higher value from a lower value.

However, for example, a metal film may be added to the excitation electrode 5a by evaporation or sputtering, whereby the oscillation frequency can be adjusted to have a lower value from a higher value.

[Seventh Step/Bonding of Metal Cover (Airtight Sealing)]

Subsequently, on the insulating film 10 which is the outer peripheral surface of the rectangular region associated with each ceramic base 1 of the sheet-like ceramic base 1A having the crystal piece 5 mounted thereon, the opening end surface (a flange lower surface) of the concave metal cover 6 is bonded through a sealant.

Here, a resin previously applied or transferred to the opening end surface of the cover 6 is used as the sealant, and it is heated, molten, and bonded. For example, the opening end surface of the cover 6 is formed into the L-like shape, and a so-called seal path is elongated. As a result, the sheet-like crystal oscillator in which the respective crystal pieces 5 are airtightly sealed and aggregated is formed.

[Eighth Step/Division]

At last, the sheet-like ceramic base in which the crystal oscillators are aggregated is extensively divided along the break lines, and each surface-mounted crystal oscillator is obtained.

Further, here, in a state of the sheet-like ceramic base state having the metal pattern or the like formed thereon, the mounting of the crystal piece 5 (the fifth step), the frequency adjustment (the sixth step), and the bonding of the cover 6 (the seventh step) can be continuously carried out, and hence an effect of improving productivity can be obtained.

Furthermore, in the first embodiment, the mounting terminals 4 on the back side of the ceramic base 1 are respective electrically independent four terminals. On the other hand, in the state of the sheet-like ceramic base, the respective mounting terminals 4 (four) at the four corner portions of each of adjacent rectangular regions are electrically connected in common via the through terminals 2b and 2c.

Therefore, even in a state that the respective mounting terminals 4 at the four corner portions are connected in common, the measuring terminal is brought into contact with the mounting terminals 4 at a pair of opposing corner portions connected to the support electrodes 3b of each ceramic base 1, thereby obtaining an effect of adjusting the oscillation frequency in accordance with each crystal piece 5.

Furthermore, although the insulating film 10 is glass, for example, even a resin can be applied as long as it has higher heat resistance that a resin of the sealant.

Moreover, although the metal pattern is made of the AgPd alloy, it is possible to use a material mainly containing Ag which has relatively excellent adherence with respect to ceramic, e.g., an AgPt (silver/platinum) alloy, and Ag-based thick film materials can be applied.

[Effect of First Embodiment]

According to the first crystal oscillator, the support electrode lower layer portions 3a, the connection terminals 2a, and the through terminals 2b and 2c are integrally formed by using the AgPd alloy, the support electrodes 3b of Ag are formed on the support electrode lower layer portions 3a, and airtight sealing is effected by using the cover 6 after mounting the crystal piece 5, and hence the support electrodes 3b are not exposed to air to be oxidized, can have a larger thickness by the single film forming operation than those made of AgPd because of use of Ag having high viscosity, and do not sag, thereby obtaining an effect of realizing miniaturization, improving quality, and enhancing productivity.

Further, in the first crystal oscillator, since each support electrode 3b is formed of the Ag film, an effect of reducing a manufacturing cost can be obtained.

Second Embodiment

A crystal oscillator (a second crystal oscillator) according to a second embodiment will now be described.

In the first embodiment, although the crystal piece 5 has a plate-like shape, the crystal piece is beveled to reduce a numerical value of CI (crystal impedance: equivalent series resistance) with a low frequency.

The beveling is a processing treatment for forming an end surface of the crystal piece into an inclined portion by chamfering. A trunk portion of the crystal piece is formed into a lens-like shape by this beveling.

When the beveled crystal piece is mounted on the support electrodes 3b, the lens-like trunk portion comes into contact, the crystal piece is lifted up at the end portions of the support electrodes 3b, and pressing of the conductive adhesive may become insufficient in some cases.

When the pressing of the conductive adhesive becomes insufficient, adhesion strength poverty of the crystal piece occurs.

Therefore, in a second crystal oscillator, a space portion is formed at a central part of each support electrode 3b to provide a shape divided into both end portions without forming the central part, the lens-like trunk portion of the crystal piece is accommodated in the space portion by supporting the crystal piece on the support electrodes 3b at both the ends, the support electrodes 3b at both the ends can come into contact with the beveled crystal piece without lifting the end surface of the crystal piece, and hence the pressing of the conductive adhesive becomes sufficient, thereby meeting the adhesion strength of the crystal piece.

It is to be noted that each support electrode lower layer portion 3a may be also divided into two portions, but the support electrode lower layer portion 3a is left as it is without being divided in order to stably form each support electrode 3b.

Figure 9:
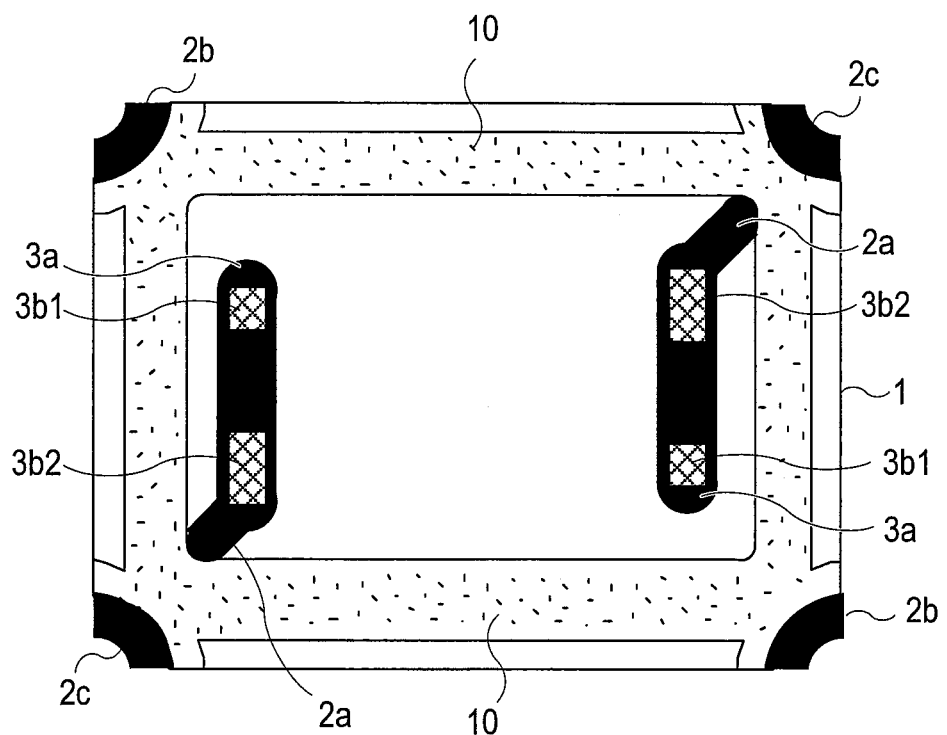
FIG. 9 is a plane explanatory view of an electrode pattern in a second crystal oscillator.

[Electrode Pattern of Second Crystal Oscillator: FIG. 9]

An electrode pattern of the second crystal oscillator will now be described with reference to FIG. 9. FIG. 9 is a plane explanatory view of an electrode pattern of the second crystal oscillator.

As shown in FIG. 9, in the second crystal oscillator, each support electrode 3b is divided and partially formed as compared with the first crystal oscillator depicted in FIG. 5.

Specifically, a first portion of the support electrode 3b1 is formed on a support electrode lower layer portion 3a on the side to which a connection terminal 2a is not formed, and a second portion of the support electrode 3b2 is formed on the support electrode lower layer portion 3a on the side to which the connection terminal 2a is connected.

It is to be noted that an area of the second portion of the support electrode 3b2 is larger than an area of the first portion of the support electrode 3b1 that is in contact with the crystal piece. That is because a conductive adhesive 7 is applied to an upper surface of the second portion of the support electrode 3b2 and the crystal piece is mounted.

Therefore, the conductive adhesive is not applied to the upper surface of the first portion of the support electrode 3b1, and the crystal piece is simply mounted.

Figure 10:
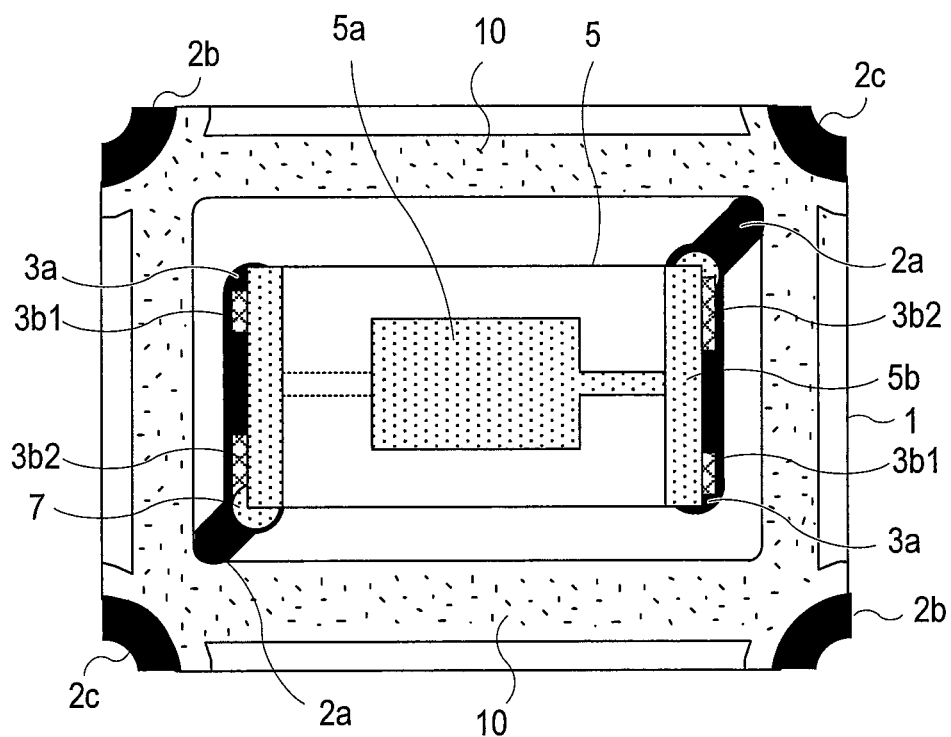
FIG. 10 is a plane explanatory view of mounting a crystal piece in the second crystal oscillator.

[Mounting of Crystal Piece in Second Crystal Oscillator: FIG. 10]

Mounting of the crystal piece in the second crystal oscillator will now be described with reference to FIG. 10. FIG. 10 is a plane explanatory view of mounting the crystal piece in the second crystal oscillator.

A crystal piece 5' in the second crystal oscillator has an end surface chambered by the bevel treatment and hence has a lens-like trunk portion.

As shown in FIG. 10, although another second crystal oscillator is basically the same as the first crystal oscillator depicted in FIG. 7, the crystal piece 5' is mounted on the first portion of each of the support electrodes 3b1 and the second portion of each of the support electrodes 3b2 which are divided from each other, and the crystal piece 5' is bonded to the second portion of each of the support electrodes 3b2 through the conductive adhesive 7 and electrically and physically connected to the same.

Figure 11:
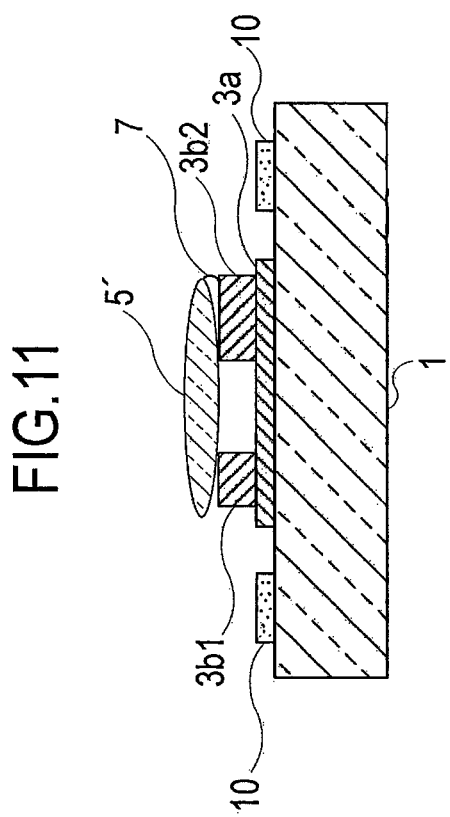
FIG. 11 is a cross-sectional explanatory view of a short side of the second crystal oscillator.

[Cross Section of Short Side in Second Crystal Oscillator: FIG. 11]

A cross section of a short side in the second crystal oscillator will now be described with reference to FIG. 11. FIG. 11 is a cross-sectional explanatory view of a short side of the second crystal oscillator.

As shown in FIG. 11, in the cross section of the short side of the substrate 1 where the first and second portions of the support electrodes 3b1 and 3b2 are present, the support electrode lower layer portion 3a is formed at the center of the substrate 1, the insulating film 10 is formed on the inner side of the periphery of the substrate 1, the first portions of the support electrode 3b1 and the second portions of the support electrode 3b2 are formed on the support electrode lower layer portion 3a, and the lens-like crystal piece 5' is fixed to the second portions of the support electrodes 3b2 through the conductive adhesive 7.

Therefore, the crystal piece 5' is just mounted on the first portions of the support electrode 3b1, and it is not fixed.

The crystal piece 5' is fixed by the conductive adhesive 7 on the two second portions of the support electrodes 3b2 formed along both the short sides. However, since the crystal piece 5' is pressed downwards, it comes into contact with the first portions of the support electrodes 3b1.

Figure 12:
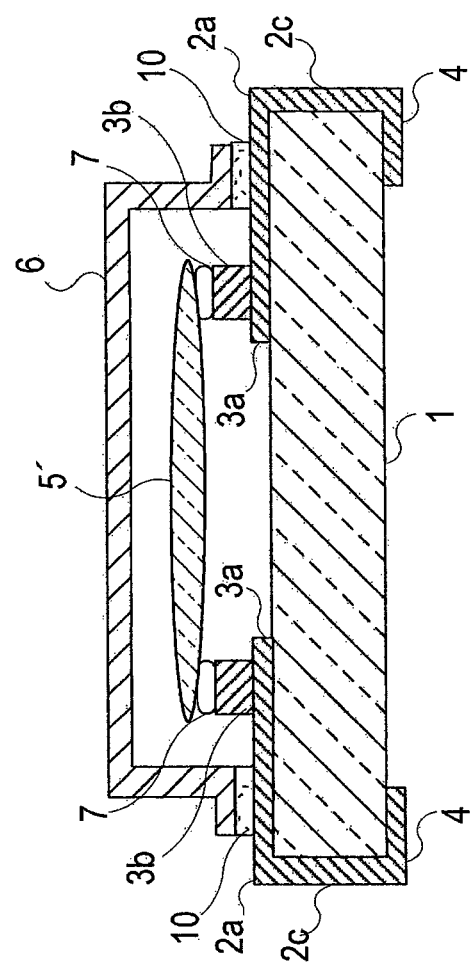
FIG. 12 is a cross-sectional explanatory view of a long side in a state that a cover is mounted on the second crystal oscillator.

[Cross Section of Long Side in Second Crystal Oscillator: FIG. 12]

A cross section of the long side in a state that the cover is mounted on the second crystal oscillator will now be described with reference to FIG. 12. FIG. 12 is a cross-sectional explanatory view of the long side in a state that the cover is mounted on the second crystal oscillator.

As shown in FIG. 12, the beveled lens-like crystal piece 5' is mounted on the two second portions of the support electrodes 3b2 through the conductive adhesive 7, and the metal cover 6 is mounted on the insulating film 10 through a resin as an insulative sealant.

Any other basic structure is the same as that in the first crystal oscillator depicted in FIG. 8.

[Manufacturing Method of Second Crystal Oscillator]

A manufacturing method of the second crystal oscillator is basically the same as the manufacturing method of the first crystal oscillator. A difference lies in that the crystal piece 5' is beveled, the space portion is provided at the central part when forming each support electrode, the first portions of the support electrodes 3b1 and the second portions of the support electrodes 3b2 divided from each other are formed by using the metal mask, and the crystal piece 5' is fixed on the second portions of the support electrodes 3b2 through the conductive adhesive.

[Effect of Second Crystal Oscillator]

According to the second crystal oscillator, it basically has the configuration of the first crystal oscillator, it has the effect of the first crystal oscillator, the space portion is provided at the central part by using each first portion of the support electrodes 3b1 and each second portion of the support electrodes 3b2 divided from each other, the lens-like trunk portion of the crystal piece 5' protrudes toward this space portion when the beveled crystal piece 5' is mounted, and hence the pressing of the conductive adhesive 7 on the second portions of the support electrode 3b2 becomes sufficient, thereby obtaining the effect of increasing the adhesion strength for the crystal piece 5'.

[Outline of Third Embodiment]

A surface-mounted crystal oscillator according to a third embodiment of the present invention is of a cantilever type that holds a crystal piece by a support electrode on one of short sides, through terminals of AgPd are formed on wall surfaces of through holes formed at corner portions of a rectangular ceramic substrate, a metal electrode of AgPd that is connected to the through terminal to form a lower layer of a support electrode is formed on a surface of the substrate, and the support electrode of Ag that holds a crystal piece is formed on this metal electrode, thereby reducing a manufacturing cost and improving productivity while realizing miniaturization.

In particular, since the support electrode is obtained by thickly forming an Ag film at a time with use of a metal mask in place of the screen mask, a manufacturing cost can be reduced, and a manufacturing process can be simplified.

Moreover, a leader wiring pattern of the connection terminal parallel to a long side of the substrate is formed on the substrate at a position where this pattern can be hidden behind the crystal piece, the leader wiring pattern is not scraped away by Ar ions at the time of frequency adjustment, and quality and productivity can be improved.

Figure 13:
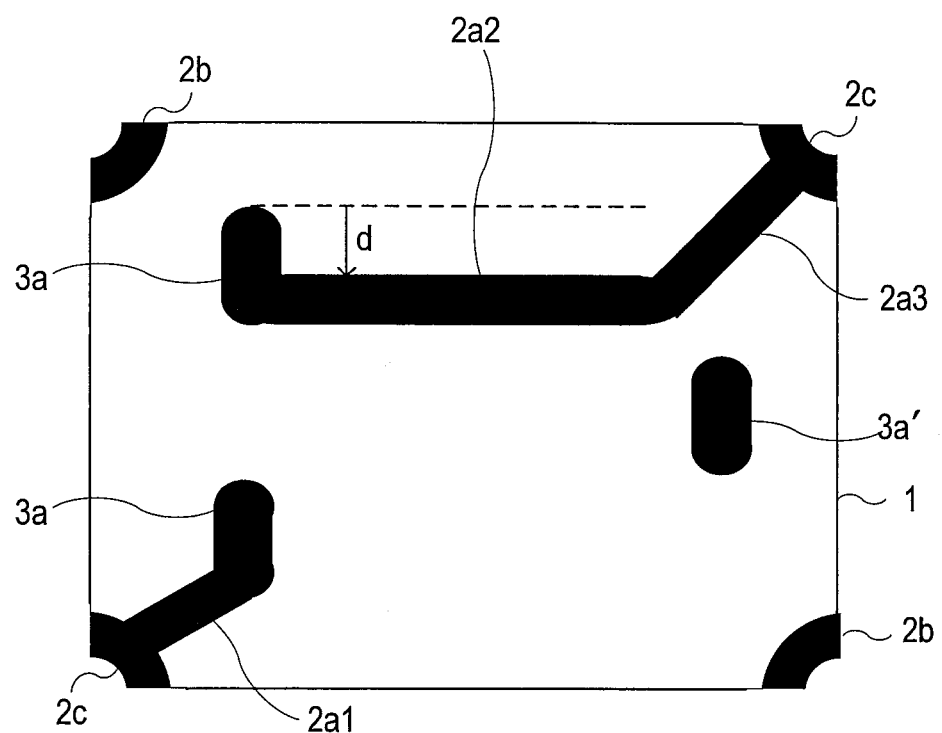
FIG. 13 is a plane explanatory view of an electrode pattern in a third crystal oscillator.

[Electrode Pattern of Third Crystal Oscillator: FIG. 13]

The surface-mounted crystal oscillator according to the third embodiment (a third crystal oscillator) of the present invention will now be described with reference to FIG. 13. FIG. 13 is a plane explanatory view of an electrode pattern in the third crystal oscillator.

As shown in FIG. 13, on a ceramic substrate (a base) 1, an electrode pattern of a metal electrode in the third crystal oscillator basically has a pattern of support electrode lower layer portions 3a serving as lower layers of support electrodes, through terminals 2b and 2c formed at four corners of the base 1, and a pattern of connection terminals 2a1, 2a2, and 2a3 that connect the support electrode lower layer portions 3a to through terminals 2c.

Here, the through terminal that is connected with the connection terminal 2a is determined as 2c and the through terminal that is not connected to the connection terminal 2a is determined as 2b so that these through terminals are discriminated from each other.

Further, since the third crystal oscillator is of the cantilever type that holds the crystal piece on one of the short sides alone, the two support electrode lower layer portions 3a are provided on one of the short sides of the base 1. Further, on the short side (the other short side of the substrate 1) opposed to this short side, a lower layer portion (a support lower layer portion) 3a' of a support portion that supports the crystal piece is formed on the other one of short sides of the crystal piece.

Each portion of the electrode pattern will now be specifically described.

In regard to the through terminals 2b and 2c, in a ceramic sheet state before dividing into a base, a through hole is formed at each interesting point of break lines that determine a region of each crystal oscillator, and a metal film is formed on a wall surface of this through hole and functions as an electrode that connects front and back sides of the base to each other.

Furthermore, each of the through terminals 2b and 2c has a fan-like pattern excluding the through hole portion on not only the wall surface of the through hole but also the front and back sides of the base so as to facilitate connection of any other electrode.

A connection terminal 2a1 is linearly connected to the through terminal 2c (the through terminal 2c on the lower left side in FIG. 13) at the corner portion which is the closest to the end portion of the support electrode lower layer portion 3a (the support electrode lower layer portion 3a in FIG. 13). In the support electrode lower layer portion 3a in particular, the connection terminal 2a1 is drawn to the through terminal 2c from the close long side of the base 1.

Moreover, a connection terminal 2a2 is drawn from the end portion of the support electrode lower layer portion 3a (the support electrode lower layer portion 3a on the upper side in FIG. 13) in parallel to the long side of the base 1 and further connected to one end of the connection terminal 2a3, and the other end of the connection terminal 2a3 is connected to the through terminal 2c (the through terminal 2c on the upper right side in FIG. 13). Specifically, the connection terminal 2a3 is obliquely formed from the through terminal 2c to the substantially central direction of the base 1.

Additionally, as characteristics of the third crystal oscillator, the connection terminal 2a2 is drawn from the end portion of the support electrode lower layer portion 3a which is the end portion on the central side of the base 1. Usually, in the support electrode lower layer portion 3a, the connection terminal 2a2 is drawn from the end portion on the close long side of the base 1, but the connection terminal 2a2 is formed to be closer to the central side by a specific distance d from the end portion on the long side in the third crystal oscillator.

That is because the crystal piece is mounted at a later step, the connection terminal 2a2 is hidden behind the back side of the crystal piece even though an excitation electrode is scraped away by Ar ions for frequency adjustment, and hence the connection terminal 2a2 is not accidentally scraped away.

Further, on the front side of the base 1, the support electrode lower layer portion 3a, the support lower layer portion 3a', and the connection terminals 2a1, 2a2, and 2a3 are integrally formed by using AgPd, and the through terminals 2b and 2c that connect the front and back sides of the base 1 are also formed.

Furthermore, on the back side of the base 1, an electrode pattern of mounting terminals connected with the respective through terminals 2b and 2c are made of AgPd.

The mounting terminal connected to the through terminal 2c is an electrode to which a voltage is applied, and the mounting terminal connected to the through terminal 2b is a GND electrode connected to the ground level.

Moreover, on the base 1, an insulating film is formed into a belt-like shape by using glass or the like on the front side of the base 1 to circle around the inner side of the outer periphery, and it covers and cuts across the connection terminals 2a1 and 2a3 on the base 1.

Additionally, the insulating film is formed on the inner side apart from the outer peripheral end of the base 1, and it does not cover the corner portions where the through terminals 2b and 2c are formed.

However, slip of the cover may be taken into consideration, and the insulating film 10 may be extended to the central side of the through terminals 2b and 2c. The central side means a portion of a line end when the corner portions of the base 1 are connected through a diagonal line.

Figure 14:
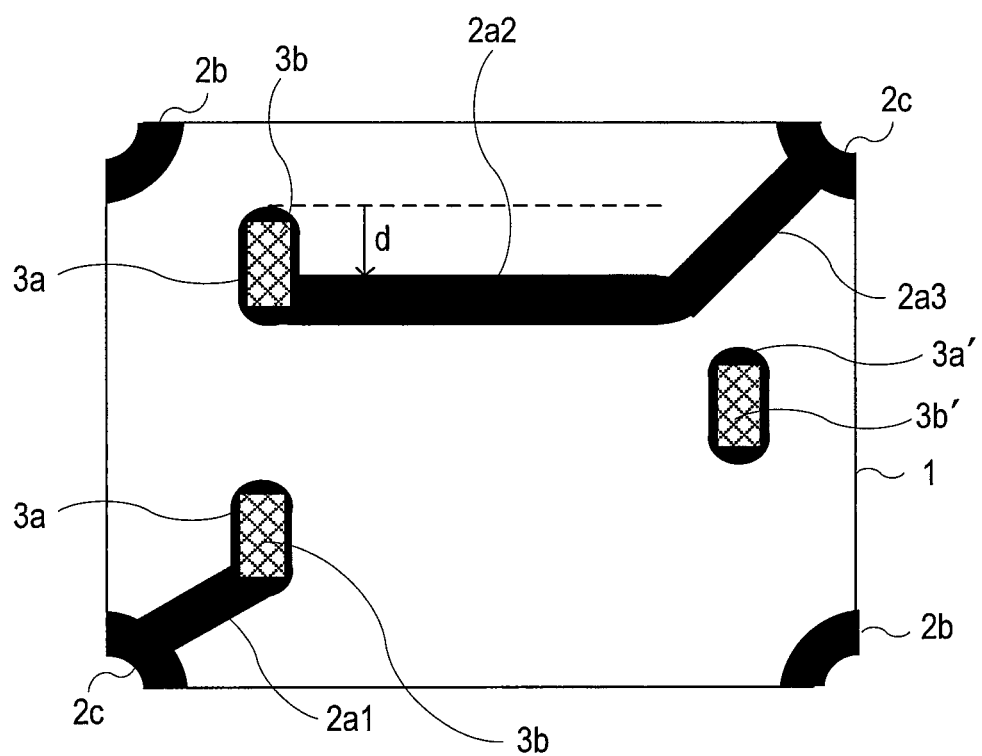
FIG. 14 is a plane explanatory view of a support electrode pattern in the third crystal oscillator.

[Support Electrode Pattern of Third Crystal Oscillator: FIG. 14]

A support electrode pattern of the third crystal oscillator will now be described with reference to FIG. 14. FIG. 14 is a plane explanatory view of a support electrode pattern in the third crystal oscillator.

As shown in FIG. 14, a support electrode 3b is laminated on each support electrode lower layer portion 3a and formed by using Ag. It is to be noted that a support portion 3b' is also formed on the support lower layer portion 3a' by using Ag.

Since Ag is used for the support electrodes 3b and the support portion 3b', viscosity is high, and a thick metal film can be formed by one applying operation using a metal mask. A thickness of the support electrodes 3b and the support portion 3b' formed by one applying operation corresponds to three layers of a conventional metal film (having low viscosity) using AgPd.

That is, to form the support electrodes 3b having the same thickness, applying the Ag film once can suffice in the third embodiment, but the conventional AgPd film must be applied three times, and a large amount of Pd is used, which results in an increase in cost and a complicated operation process.

Further, since Ag having high viscosity is used for the support electrodes 3b, these electrodes do not sag and not protrude from the support electrode lower layer portions 3a, and a possibility of a short circuit can be reduced even though the metal cover slips.

Figure 15:
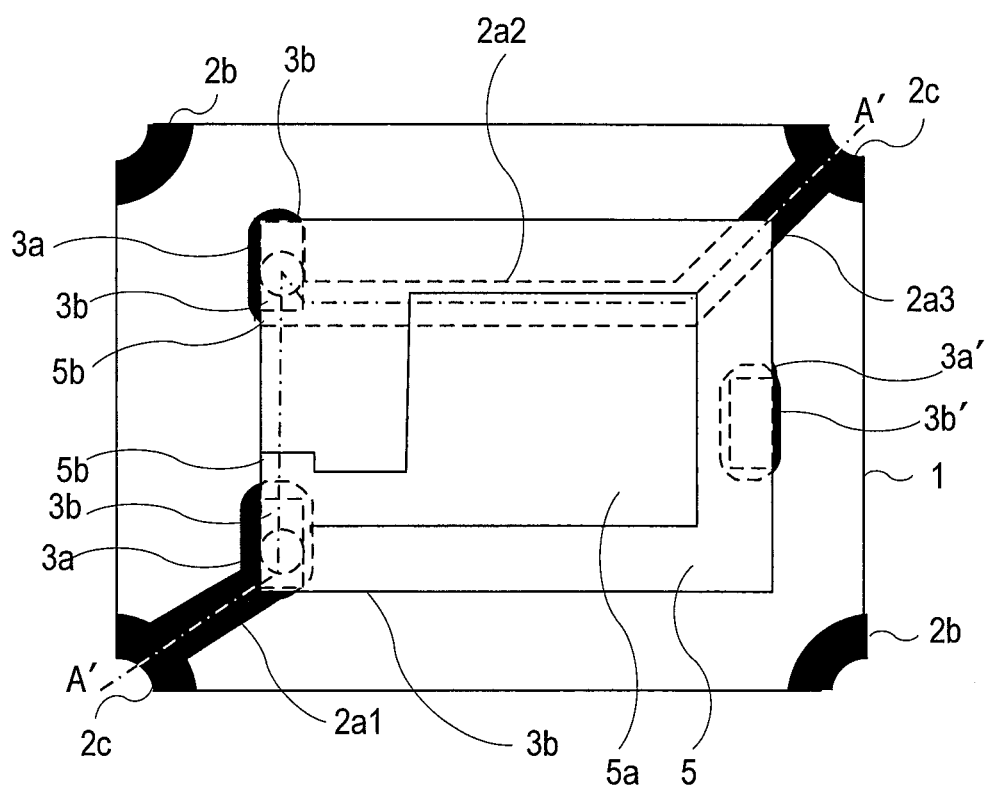
FIG. 15 is a plane explanatory view of mounting a crystal piece in the third crystal oscillator.

[Mounting of Crystal Piece of Third Crystal Oscillator: FIG. 15]

Mounting of the crystal piece of the third crystal oscillator will now be described with reference to FIG. 15. FIG. 15 is a plan explanatory view of mounting a crystal piece in the third crystal oscillator.

A crystal piece 5 is AT-cut and has opposed excitation electrodes 5a formed on both main surfaces thereof.

Further, extracting electrodes 5b which are extended from the respective excitation electrodes 5a to end portions in the same direction and folded back over the entire width in the width direction are formed to the crystal piece 5.

Furthermore, extended end portions of the extracting electrodes 5b are secured to the support electrode 3b through a conductive adhesive as a conductor, thereby electrically/mechanically connecting the extracting electrodes 5b to the support electrode 3b.

Moreover, as described above, since the connection terminal 2a2 is hidden behind the crystal piece 5, the connection terminal 2a2 is not accidentally scraped away even though each excitation electrode is scraped away by Ar ions for frequency adjustment.

Figure 16:
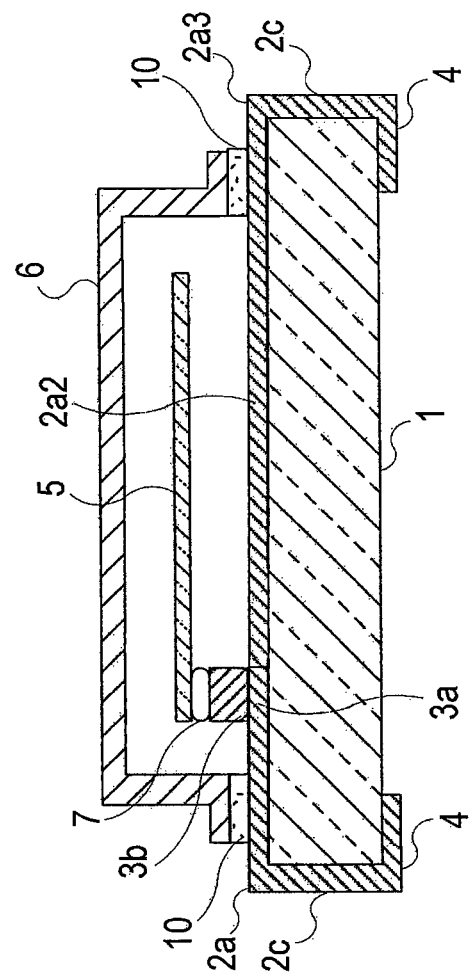
FIG. 16 is a cross-sectional explanatory view of a state that a cover is mounted on the third crystal oscillator.

[Cross Section of Third Crystal Oscillator: FIG. 16]

A cross section in a state that the cover is mounted on the third crystal oscillator will now be described with reference to FIG. 16. FIG. 16 is a cross-sectional explanatory view of a state that the cover is mounted on the third crystal oscillator. In particular, FIG. 16 is a cross-sectional explanatory view of a portion A'-A' in FIG. 15.

As shown in FIG. 16, the support electrode lower layer portions 3a, the support lower layer portion 3a', and the connection terminals 2a1, 2a2, and 2a3 are formed on the front side of the base 1, the through terminals 2b and 2c are formed at the four corner portions of the base 1, and the mounting terminals 4 are formed on the back side of the base 1 by using AgPd.

Further, the support electrodes 3b of Ag are formed on the support electrode lower layer portions 3a, and the crystal piece 5 is bonded to the support electrodes 3b through the conductive adhesive 7.

Furthermore, the insulating film 10 is formed around the base 1, and the metal cover 6 is mounted on the insulating film 10 through a resin as an insulative sealant.

The cover 6 has a concave shape, an opening end surface thereof is bent into an L-like shape, this concave shape is turned upside down, and the L-like portion is bonded to the insulating film 10 through the resin as the sealant.

When using the cover 6 for sealing, since airtight sealing is effected by N2 purge, the support electrodes 3b and the support portion 3b' made of Ag are not oxidized, and there is no problem in quality.

[Manufacturing Method of Third Crystal Oscillator]

A manufacturing method of the third crystal oscillator will now be described.

[First Step/Baking of Sheet-Like Ceramic Material]

First, a sheet-like ceramic material from which a sheet-like ceramic base is made is formed.

In the sheet-like ceramic material, break lines that partition adjacent regions in accordance with respective ceramic bases 1 are formed, and through holes are formed at four corner portions (corner portions).

Furthermore, the sheet-like ceramic materials having the through holes formed therein are baked, thereby obtaining the sheet-like ceramic bases.

[Second Step/Formation of Circuit Pattern]

Then, in a region associated with a circuit pattern of the sheet-like ceramic base, a metal paste of an AgPd alloy is formed with a thickness of approximately 10 μm by printing using a screen mask.

As the circuit pattern, a metal pattern is formed on one main surface (the front side) as shown in FIG. 13, a pattern of the mounting terminals 4 is formed on the other main surface (the back side), and the through terminals 2b and 2c are formed on the wall surfaces of the through holes.

Moreover, a metal paste containing an AgPd alloy is baked at approximately 850° C., a binder in the metal paste is evaporated, and the AgPd alloy is molten and solidified, whereby the sheet-like ceramic base having the metal pattern formed thereof is obtained.

It is to be noted that, since a firing temperature of the ceramic is approximately 1500 to 1600° C. and the same of the AgPd alloy is 850° C. which is lower than the former temperature, the AgPd alloy paste is applied after baking the ceramic, and the AgPd alloy paste is baked together with the ceramic.

That is because, when the ApPd alloy paste is applied to the ceramic material and baking is performed at the firing temperature of the ceramic, the AgPd alloy paste has an extremely high temperature and becomes aggregate particles and the circuit pattern cannot be formed.

[Third Step/Formation of Insulating Film 10]

Formation of the insulating film 10 will now be described.

A glass paste is formed by printing as the insulating film 10 on the inner side of the periphery of each rectangular region (corresponding to each base 1) of the sheet-like ceramic base having the metal pattern or the like formed thereon.

Additionally, baking is performed at a temperature of approximately 850° C., and the glass is solidified.

[Fourth Step/Formation of Support Electrode 3b]

Formation of the support electrode 3b will now be described.

As shown in FIG. 14, each support electrode 3b and the support portion 3b' are formed of a metal film of Ag on the support electrode lower layer portion 3a and the support lower layer portion 3a' of AgPd by using a metal mask of nickel (Ni).

Since the support electrode 3b or the like is the metal film of Ag, it has high viscosity, and a thick film can be formed by a single film forming operation. Therefore, the support electrode 3b does not sag and does not protrude from the support electrode lower layer portion 3a.

[Fifth Step/Mounting of Crystal Piece]

Then, the crystal piece 5 having each extracting electrode 5b protruding from the excitation electrode 5a is secured to, mounted on, and electrically/mechanically connected through the conductive adhesive 7 to the respective support electrodes 3b of the sheet-like ceramic base having the metal pattern or the like formed thereof.

[Sixth Step/Frequency Adjustment]

Then, an oscillation frequency of each crystal piece 5 as a crystal oscillator mounted (secured) on the sheet-like ceramic base is adjusted by a mass loading effect.

Specifically, on the back side of the sheet-like ceramic base, a measuring terminal (a probe) from a measuring instrument is brought into contact with each mounting terminal 4 electrically connected to each crystal piece 5. Further, Ar gas ions are applied to the excitation electrode 5a on the front side of the crystal piece 5 having an exposed plate surface, this surface is scraped away, a mass of the excitation electrode 5a is reduced, and the oscillation frequency is adjusted to have a higher value from a lower value.

However, for example, a metal film may be added to the excitation electrode 5a by evaporation or sputtering, whereby the oscillation frequency can be adjusted to have a lower value from a higher value.

[Seventh Step/Bonding of Metal Cover (airtight sealing)]

Subsequently, on the insulating film 10 which is the outer peripheral surface of the rectangular region associated with each ceramic base 1 of the sheet-like ceramic base 1A having the crystal piece 5 mounted thereon, the opening end surface (a flange lower surface) of the concave metal cover 6 is bonded through a sealant.

Here, a resin previously applied or transferred to the opening end surface of the cover 6 is used as the sealant, and it is heated, molten, and bonded. For example, the opening end surface of the cover 6 is formed into the L-like shape, and a so-called seal path is elongated. As a result, the sheet-like crystal oscillator in which the respective crystal pieces 5 are airtightly sealed and aggregated is formed.

[Eighth Step/Division]

At last, the sheet-like ceramic base in which the crystal oscillators are aggregated is extensively divided along the break lines, and each surface-mounted crystal oscillator is obtained.

Further, here, in a state of the sheet-like ceramic base state having the metal pattern or the like formed thereon, the mounting of the crystal piece 5 (the fifth step), the frequency adjustment (the sixth step), and the bonding of the cover 6 (the seventh step) can be continuously carried out, and hence an effect of improving productivity can be obtained.

Furthermore, in the third embodiment, the mounting terminals 4 on the back side of the ceramic base 1 are respective electrically independent four terminals. On the other hand, in the state of the sheet-like ceramic base, the respective mounting terminals 4 (four) at the four corner portions of each of adjacent rectangular regions are electrically connected in common via the through terminals 2b and 2c.

Therefore, even in a state that the respective mounting terminals 4 at the four corner portions are connected in common, the measuring terminal is brought into contact with the mounting terminals 4 at a pair of opposing corner portions connected to the support electrodes 3b of each ceramic base 1, thereby obtaining an effect of adjusting the oscillation frequency in accordance with each crystal piece 5.

Furthermore, although the insulating film 10 is glass, for example, even a resin can be applied as long as it has higher heat resistance than a resin of the sealant.

Moreover, although the metal pattern is made of the AgPd alloy, it is possible to use a material mainly containing Ag which has relatively excellent adherence with respect to ceramic, e.g., an AgPt (silver/platinum) alloy, and Ag-based thick film materials can be applied.

[Effect of Third Embodiment]

According to the third crystal oscillator, in the cantilever type, the support electrode lower layer portions 3a, the support lower layer portion 3a', the connection terminals 2a1, 2a2, and 2a3, and the through terminals 2b and 2c are integrally formed by using the AgPd alloy, the support electrodes 3b and the support portion 3b' of Ag are formed on the support electrode lower layer portions 3a and the support lower layer portion 3a', and airtight sealing is effected by using the cover 6 after mounting the crystal piece 5, and hence the support electrodes 3b and the support portion 3b' are not exposed to air to be oxidized, can have a larger thickness by the single film forming operation than those made of AgPd because of use of Ag having high viscosity, and do not sag, thereby obtaining an effect of realizing miniaturization, improving quality, and enhancing productivity.

Further, in the third crystal oscillator, since the support electrodes 3b and the support portion 3b' are formed of the Ag film, an effect of reducing a manufacturing cost can be obtained.

Furthermore, according to the third crystal oscillator, since the connection terminal 2a2 is formed to be closer to the central side than the long side of the base 1, the connection terminal 2a2 is hidden behind the crystal piece 5 when the crystal piece is mounted, and hence the connection terminal 2a2 is not accidentally scraped away even though the excitation electrode is scraped away by Ar ions for frequency adjustment, thereby obtaining an effect of improving quality and enhancing productivity.

The present invention is preferable for the surface-mounted crystal oscillator and the manufacturing method thereof that can realize miniaturization, improve quality, reduce a manufacturing cost, and enhance productivity.

What is claimed is:

1. A surface-mounted crystal oscillator which has a crystal piece mounted on a substrate which is a rectangular ceramic substrate, comprising:
    first and second support electrodes which hold the crystal piece;
    through terminals which are formed on wall surfaces of through holes formed at corner portions of the substrate;
    first and second lower layer portions which are formed in lower layers of the first and second support electrodes on a front side of the substrate;
    a first connection terminal which connects an end portion of the first lower layer portion to the through terminal at the corner portion that is the closest to the end portion;
    a second connection terminal which connects an end portion of the second lower layer portion to the through terminal at the corner portion that is the closest to the end portion; and
    a cover which covers and airtightly seals the crystal piece,
    wherein the through terminals, the lower layer portions, and the connection terminals are formed of an antioxidant metal film, and
    the first and second support electrodes are formed by using silver.

2. The surface-mounted crystal oscillator according to claim 1,
    wherein the first connection terminal and the second connection terminal are connected to the through terminals at the opposing corners of the substrate, and the end portions of the first and second lower layer portions to which the first and second connection terminals are not connected are shorter than the end portions of the first and second lower layer portions to which the first and second connection terminals are connected.

3. The surface-mounted crystal oscillator according to claim 1,
    wherein a belt-like insulating film on which the cover is mounted is formed on the inner side of the periphery of the substrate.

4. The surface-mounted crystal oscillator according to claim 1,
    wherein the antioxidant metal film is formed by using an alloy containing silver as a main component.

5. The surface-mounted crystal oscillator according to claim 4,
    wherein the antioxidant metal film is formed by using an alloy of palladium containing silver as a main component.

6. The surface-mounted crystal oscillator according to claim 1,
    wherein the crystal piece is beveled and has inclined short sides, and
    each of the first and second support electrodes is divided into a first portion and a second portion and formed at the end portions of each of the first and second lower layer portions in such a manner that a space portion is formed at a central part of each of the first and second lower layer portions above each lower layer portion.

7. The surface-mounted crystal oscillator according to claim 6,
wherein the beveled crystal piece is fixed through a conductive adhesive to an upper side of the second portion of each of the divided first and second support electrodes formed at the end portions of each of the first and second lower layer portions connected to the first and second connection terminals.

8. The surface-mounted crystal oscillator according to claim 7,
wherein a surface area of the second portion of each of the divided first and second support electrodes is larger than a surface area of the first portion of each of the divided first and second support electrodes formed on the end portion of each of the first and second lower layer portions that are not connected to the first and second connection terminals.

9. A manufacturing method of a surface-mounted crystal oscillator which has a crystal piece mounted on a substrate which is a rectangular ceramic substrate, comprising:
forming through terminals on wall surfaces of through holes formed at corner portions of the substrate;
using an antioxidant metal film to form, on a front side of the substrate, first and second lower layer portions in lower layers of first and second support electrodes which hold the crystal piece, a first connection terminal which connects an end portion of the first lower layer portion to the through terminal at the corner portion that is the closest to the end portion, and a second connection terminal which connects an end portion of the second lower layer portion to the through terminal at the corner portion that is the closest to the end portion;
forming the first and second support electrodes on the first and second lower layer portions by using silver; and
providing a cover which covers and airtightly seals the crystal piece.

10. The manufacturing method of a surface-mounted crystal oscillator according to claim 9,
wherein the first connection terminal and the second connection terminal are connected to the through terminals at the opposing corners of the substrate, and the end portions of the first and second lower layer portions to which the first and second connection terminals are not connected are shorter than the end portions of the first and second lower layer portions to which the first and second connection terminals are connected.

11. The manufacturing method of a surface-mounted crystal oscillator according to claim 9,
wherein the first and second support electrodes are formed by a single operation using a metal mask.

12. The manufacturing method of a surface-mounted crystal oscillator according to claim 9,
wherein the crystal piece which is beveled and has inclined short sides is mounted on the surface-mounted crystal oscillator, and
each of the first and second support electrodes is divided into a first portion and a second portion and formed at the end portions of each of the first and second lower layer portions in such a manner that a space portion is formed at a central part of each of the first and second lower layer portions above each lower layer portion.

13. The manufacturing method of a surface-mounted crystal oscillator according to claim 12,
wherein the beveled crystal piece is fixed through a conductive adhesive to an upper side of the second portion of each of the divided first and second support electrodes formed at the end portions of each of the first and second lower layer portions connected to the first and second connection terminals.

14. The manufacturing method of a surface-mounted crystal oscillator according to claim 13,
wherein a surface area of the second portion of each of the divided first and second support electrodes is larger than a surface area of the first portion of each of the divided first and second support electrodes formed on the end portion of each of the first and second lower layer portions that are not connected to the first and second connection terminals.

15. A surface-mounted crystal oscillator which has a crystal piece mounted on a substrate which is a rectangular ceramic substrate, comprising:
first and second support electrodes each of which holds the crystal piece on one of short sides thereof;
through terminals formed on wall surfaces of through holes formed at corner portions of the substrate;
first and second lower layer portions which are formed in lower layers of the first and second support electrodes on a front side of the substrate;
a first connection terminal which connects an end portion of the first lower layer portion to the through terminal at the corner portion that is the closest to the end portion;
a second connection terminal which connects an end portion of the second lower layer portion to the through terminal at the corner portion that is an opposing corner of the through terminal connected with the first lower layer portion; and
a cover which covers and airtightly seals the crystal piece,
wherein the through terminals, the lower layer portions, and the connection terminals are formed of an antioxidant metal film, and the first and second support electrodes are formed by using silver.

16. The surface-mounted crystal oscillator according to claim 15,
wherein the second connection terminal has: a first portion having one end connected to an end portion of the second lower layer portion on a substrate center side and the other end extended in a direction of the through terminal connected along a long side of the substrate; and a second portion having one end connected with the other end of the first portion and the other end connected with the through terminal.

17. The surface-mounted crystal oscillator according to claim 15,
wherein a belt-like insulating film on which the cover is mounted is formed on the inner side of the periphery of the substrate.

18. The surface-mounted crystal oscillator according to claim 15,
wherein the antioxidant metal film is formed by using an alloy which contains silver as a main component.

19. The surface-mounted crystal oscillator according to claim 18,
wherein the antioxidant metal film is formed by using an alloy of palladium which contains silver as a main component.

* * * * *